United States Patent [19]

Takagi

[11] 4,152,478
[45] May 1, 1979

[54] IONIZED-CLUSTER DEPOSITED ON A SUBSTRATE AND METHOD OF DEPOSITING IONIZED CLUSTER ON A SUBSTRATE

[75] Inventor: Toshinori Takagi, Nagaokakyo, Japan

[73] Assignee: Futaba Denshi Kogyo Kabushiki Kaisha, Mobara, Japan

[21] Appl. No.: 625,041

[22] Filed: Oct. 23, 1975

[30] Foreign Application Priority Data

| Oct. 23, 1974 | [JP] | Japan | 49/129321[U] |
| Oct. 23, 1974 | [JP] | Japan | 49/129322[U] |
| Jan. 13, 1975 | [JP] | Japan | 50/7303[U] |
| Jan. 13, 1975 | [JP] | Japan | 50/7305[U] |
| Mar. 29, 1975 | [JP] | Japan | 50/42658[U] |
| May 20, 1975 | [JP] | Japan | 50/60660 |
| Jul. 15, 1975 | [JP] | Japan | 50/86973 |
| Aug. 6, 1975 | [JP] | Japan | 50/96461 |

[51] Int. Cl.² .............................................. C23C 15/00
[52] U.S. Cl. .............................. 428/221; 204/192 N; 219/10.55 R; 219/50; 219/121 R; 427/38; 427/42; 427/82; 427/248 R; 428/542

[58] Field of Search ............... 427/38, 39, 42, 82, 427/248 R; 118/49.1, 49.5; 428/221, 542; 204/192 N; 219/10.55 R, 50, 121 R

[56] References Cited

U.S. PATENT DOCUMENTS

| 3,793,070 | 2/1974 | Schoolar | 118/49.1 X |
| 3,847,114 | 11/1974 | Kiyozumi | 118/49.1 |
| 3,912,826 | 10/1975 | Kennedy | 427/38 X |

Primary Examiner—Bernard D. Pianalto
Attorney, Agent, or Firm—Birch, Stewart, Kolasch and Birch

[57] ABSTRACT

The present ion source called "Vaporized-Metal Cluster Ion Source" is adapted to produce ionized vapor aggregate (ionized cluster) instead of atomic or molecular ions in conventional ion sources. Clusters consisting of $10^2$–$10^3$ atoms are formed by the adiabatic expansion due to the ejection into a high vacuum region through a nozzle of a heated crucible and ionized by electron bombardment. By "Ionized-Cluster Beam Deposition" using the ion source, fine-quality deposited films of many kinds of materials can be obtained on metal, semiconductor and insulator substrate with strong adhesion and with a fairly high deposition rate.

20 Claims, 23 Drawing Figures

IONIZED-CLUSTER DEPOSITED ON A SUBSTRATE AND METHOD OF DEPOSITING IONIZED CLUSTER ON A SUBSTRATE

BACKGROUND OF THE INVENTION

1. Field of the Invention

The present invention relates to a film deposition method and a device therefor.

2. Description of Prior Art

In the past, several approaches were suggested as an alternative to the conventional electrochemical plating technology, for the purpose of depositing a thin-film material on a substrate or plating or coating the same with such a thin-film, for example, the vacuum evaporation method and the deposition method utilizing ionization and acceleration of particles. In particular, the latter method has the advantageous characteristics that adhesion is excellent and surface cleaning and film deposition are contigeously carried out. It may be generally classified into two categories; (i), the so-called "system operating in a discharge region" wherein, as the substrate of metal material serving as a negative discharge electrode, a glow discharge is established with the aid of discharge sustaining gas and the proper material to be deposited on the substrate is vapourized and ionized in the discharge region and then accelerated toward the substrate supplied with negative voltage to form a thin-film of desired thickness on the substrate: and (ii), the so-called "system operating in a high vacuum region" wherein ionization is achieved within a discharge chamber and the thus obtained ions are extracted from a small aperture formed in the discharge chamber with the use of an ion extractor electrode supplied with negative voltage and are accelerated toward the high vacuum region with the result that ions having substantially the same flight direction and kinetic energy reach the substrate in the form of a single beam. Nevertheless, while the system (i) has advantages that the structure is simple and deposition rate is considerably high and the film deposition is accomplished on not only one of major surfaces of the substrate confronting a source of material vapour but also the remaining surfaces of the substrate, it is disadvantageous in that substrate temperature is remarkably increased because of the substrate operating as one of the discharge electrodes within the discharge region and the film deposition is of the non-directional and porosity nature because the kinetic energy values of the respective ions are not equal. On the other hand, the system (ii) is found advantageous since no increase in substrate temperature occurs and the substrate is free from the restrictions on material and further ion acceleration is substantially uniform in energy and direction to thereby form fine-quality disposed films of various kinds. However, the structure is complex and the deposition rate is low.

SUMMARY OF THE INVENTION

It is, therefore, an object of the present invention to provide an improved method for thin-film deposition which may overcome the above described shortages while enjoying the advantages of both of the systems (i) and (ii).

It is another object of the present invention to provide an improvement in film deposition technique which deposits fine quality films on various kinds of substrates (metals, semiconductors, insulators) with a simplified structure, increased deposition rate and at low temperature.

It is still another object of the present invention to provide an improved thin-film deposition technique applicable to not only ion plating, ion coating but also to thick-film deposition.

To achieve the objects set forth above, in accordance with teachings of the present invention, a desired material to be deposited is introduced and heated within a sealed crucible having one or more nozzles (or ejection apertures). The gas pressure of a high vacuum region (less than $10^{-4}$ Torr.) in which the crucible is disposed is held more than 10 times smaller than that of the vapour of the material which is formed and held at a thermal equilibrium state within the heated crucible. By ejection into the low gas pressure region through the nozzles, the vapour of the material is forced into a supercooled state about the nozzles with the result in the formation of material vapour aggregates (clusters) due to the adiabatic expansion. This is one of the essential features of the present invention.

Then, ionization of only one atom out of the atoms constituting the material vapour aggregates or clusters permits the entity of the clusters to be ionized and they are provided with kinetic energy by an ion extracter electrode held at a negative high potential. The result is that a thick-film may be disposed easily on an insulator substrate with a relatively small charge-mass ratio. This is another important feature of the present invention.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Generally speaking, ions obtainable through a conventional ion source by ionization of elements due to electron bombardment discharge in gaseous state, mainly comprises atomic or molecular monovalent ions. Merely, ionization is one way to give a kinetic energy in view of ion beam deposition and these atomic or molecular ions are, therefore, not necessarily required.

A multiplicity of atoms are combined in the order of 3, 7, ..., $10^2$, ... by the binding force of "Van der Waals" to form an atom aggregate or cluster. This permits the entity of the cluster to be ionized and accelerated and supplied with kinetic energy in response to a negative high potential by ionizing only one atom within the atom aggregate (cluster).

Figure 1:
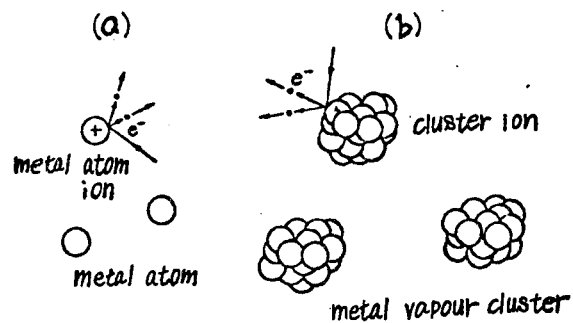
FIG. 1 is a schematic illustration of a metal atom with an ion and a metal vapour cluster with an ion.

FIG. 1 schematically illustrates an atom ion and a cluster ion, wherein the section (a) shows a metal atom and a metal atom ion and section (b) shows a metal vapour cluster or atom aggregate together with a cluster ion. In case of metal materials where atom spacing is narrow, the "Van der Waals" force binding these atoms is extremely tight such that stable cluster is obtainable easily and the ionization sectional area is extremely increased in proportion with the mass of the cluster since all that is necessary to ionize the entity of the cluster is to ionize the single atom therein. Moreover, the ionization potential of the atom cluster will vary under the influence of the binding force and become lower than that of the sole atom, to thereby enable effective ionization by colliding the cluster with an electron beam.

Figure 2:
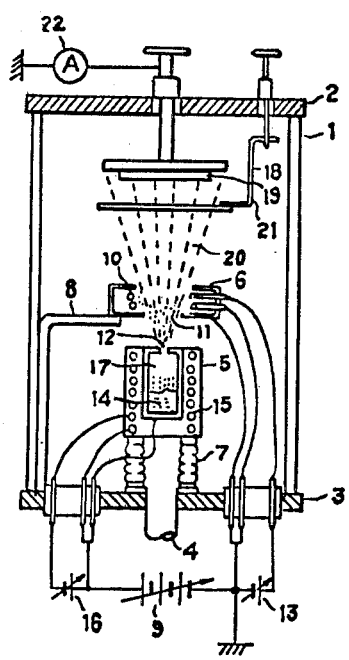
FIG. 2 is a cross-sectional view of a general construction of one preferred form of a cluster ion source embodying the present invention.

FIG. 2 illustrates one of preferred forms of an ionized cluster ion source embodying the present invention and the principles of operation of the invented ionized cluster ion soure will be now discussed with reference to FIG. 2.

A vessel defined by a bell jar (glass) 1, an upper base (metal plate) 2 and a lower base (metal plate) 3 is held at a high vacuum state in the order of $10^{-3}$–$10^{-6}$ mmHg (Torr.) through an exhaust opening 4. Within the vacuum vessel there are disposed a material vapour crucible 5 and an ion extractor electrode assembly 6 in a predetermined spaced relationship through the use of mechanical supports 7 and 8 therefor. A power supply includes a direct current high voltage source of more than several ten volts (in the inventor's experiments high voltage sources up to ten and several KV were used). Employment of power voltage of more than several ten volts implies that positive ions rather than negative ions are utilized in order to give electrons the kinetic energy sufficient for ionization. The direct current high voltage source 9 (several ten V–several KV) provides high voltage between the crucible 5 and the ion extractor electrode 6, with the former positive and the latter negative. The ion extractor electrode 6 which has a doughnut shape is also called a doughnut shaped ion accelerator electrode. A filament 10 of one-turn or multiple-turn disposed within the interior of the doughnut shaped ion extractor electrode 6 of rectangular cross section emits a multiplicity of electrons, which in turn are accelerated and focused in the form of beams 11 to strike about a vapour ejection aperture 12 formed in the axial direction of the crucible 5 under control of an electric field established between the ion extractor electrode 6 held at the same potential as that of the filament 10 and the material vapour crucible 5 held at the high potential. Heating power to the electron emitting filament 10 is supplied via a power source 13.

A proper material 14 desired to be vapourized is placed into the interior of the crucible 5 and then heated in such a manner that the vapour pressure of the material 14 is equal to or higher than about $10^{-2}$ mmHg (Torr.). It is desirable that the metal vapour pressure within the crucible is generally higher than $10^{-2}$ Torr. and the inventor's experiments were carried out in the range of $10^{-2}$–10 Torr. Heating power is supplied from a power source 16. In the case that the material 14 will boil within the crucible, it is required to prevent the vapour from escaping through the ejection aperture 12. Thus, the crucible is filled with the material vapour 17 at a vapour pressure corresponding to the heated temperature so that the material vapour is discharged in a jet through the aperture 12 due to difference in gas pressure between the interior of the crucible and the ambient atmosphere. It will be noted that the material vapour is discharged in the form of an aggregate of atoms or molecules made up of several to several thousands atoms or molecules (generally, less than $10^{14}$ atoms or molecules), that is, in the form of a cluster, and not in the form of independent atoms or molecules. The cluster constituting, for example, $10^2$–$10^3$ atoms or molecules is stable and practical for use.

The mechanism of cluster formation can be discussed by referring to microscopic analysis based upon statistical mechamics taking into account inter-molecular forces or the liquid drop theory based upon thermodynamics. The following sets forth only the microscopic analysis taking into account inter-molecular forces.

Random thermal energy of a gas can be converted into directed kinetic energy, when the gas expands out of a nozzle into the vacuum region. Under proper stagnation condition, the expanding gas becomes supersaturated by the adiabatic expansion, resulting in the condensation of the gas. Instead of the equation $PV=RT$ for the perfect gas, the equation of state for N identical particles in a condensed system can be given as follows:

$$P=-(\partial A/\partial V)_T \tag{1}$$

Where the Helmholtz Free Energy A and Partition function Q are given as follows:

$$A=-KT\ln Q \tag{2}$$

$$Q=1/N!h^f \int\int \ldots \int e^{-H(p,q)/kT} dp_1 \ldots dp_f dp_1 \ldots dp_f \tag{3}$$

in which T, V, h, and f represent temperature, volume, Plank's constant, and the number of degree of freedom of the complete system, respectively. If a term of random thermal energy, $\overline{T}$, and a term of potential energy, $\overline{V}$, are expressed as a function of coordinates q and momenta p, Hamiltonian function $\overline{H}$ $(p_1 \ldots p_f, q_1 \ldots q_f)$ is expressed as $$\overline{H}(p,q)=\overline{T}(p,q)+\overline{V}(q). \tag{4}$$

In a crucible, a metal vapour at a high temperature has a sufficient random thermal energy to overcome the attractive potential energy. Thus, $$\overline{T}(p, q) >> \overline{V}(q). \tag{5}$$

The density of the particles outside of the crucible is approximately equal to or less than that in the crucible, so that Eqs. (1)–(3) must be used to determine the kinetic state after the adiabatic expansion at the condition of $$\overline{T}(p, q) << \overline{V}(q). \tag{6}$$

A theoretical prediction of the above conditions including the adiabatic expansion is seemed very difficult, and the kinetics leading to the cluster formation under the conditions of Eqs. (5) and (6) has not been analyzed quantitatively. In the present section, rough estimation to the possibilities of metal cluster formation will be given.

Suppose that the metal vapour (pressure $P_1$ and temperature $T_1$) in the crucible passes through a nozzle and expands into a chamber with a low gas pressure $P_2$ (about $10^{-6}$–$10^{-4}$ Torr.). If it is assumed that two nonpolar particles interact, $\overline{V}$ (q) represents long-range forces of attraction obeyed by the Van der Waals force between them as a function of coordinate r. By the unit of K, the $\overline{V}$ (q) is expressed as $\overline{V}$ (r), that is, $$V(r) \approx 6.68 \times 10^{-43} r_0^5 / r^6 \, (K) \tag{7}$$

where $r_0$ is the atomic radius in cm and r is the distance between particles in cm. The expanded vapour temperature $T_2$ can be obtained from the equation of the adiabatic expansion as $$T_2/T_1 = (P_2/P_1)^{\tau - 1/\tau} \tag{8}$$

where $\tau$ is the ratio of specific heats of the metal vapour.

It may be assumed that the particles form a cluster in the region where as long-range force V (r) in Eq. (7) is atronger than random thermal energy of the particles represented by $T_2$ in Eq. (8). If R is assumed to be the distance r that satisfies the equation, $T_2 \approx V$ $(r)_{r=R}$, using V (r) or Eq. (7) and $T_2$ of Eq. (8), particles within the limiting radius $r \leq R$ aggregate. Another way of the cluster formation can be expected in such an occasion that a long-range force becomes effective when particels approach close enough through collisions. In this process, the clusters are formed even though particles have been away from each other. Thus, particles are formed to a cluster beam while they drift through a high vacuum region after being ejected from a crucible. By preliminary calculation, the cluster size of Pb was evaluated to be about $8 \times 10^2$ under the conditions where $P_1 = 1$ Torr., $P_2 = 10^{-5}$ Torr. and the length $= 4$ cm.

Although the foregoing discussion is dependent upon some assumptions, the calculated values of the cluster size take about 1000 and substantially approximate the experimental values described below. This suggests that the above mentioned reasoning as to how to form the cluster is correct.

Since the atom or molecular aggregate called cluster is tied up with the Van Der Waals' force, it shows a tendency to break up upon collision with residual gases and so forth and to facilitate its ionization by electron bombardment. In other words, the ionization voltage of the cluster becomes lower than that of the indivisual atomic particles and therefore the ionization cross section becomes greater in proportion as the mass of the cluster increases.

When striking with the electron beam 11 set forth above, the cluster via the vapour nozzle 12 is ionized effectively and efficiently and the thus ionized cluster is accelerated in the direction opposite to the accelerated electron beam 11 under control of the same electric field which serves to orient the electron beam 11 toward the crucible 5, toward a substrate 19 after passing through the central portion of the doughnut shaped ion extractor electrode 6 together with neutral particles with accompanying hydrodynamical ejection energy. The clusters 20 oriented toward the substrate 19 include the partially ionized clusters and the neutral clusters.

Figure 3:
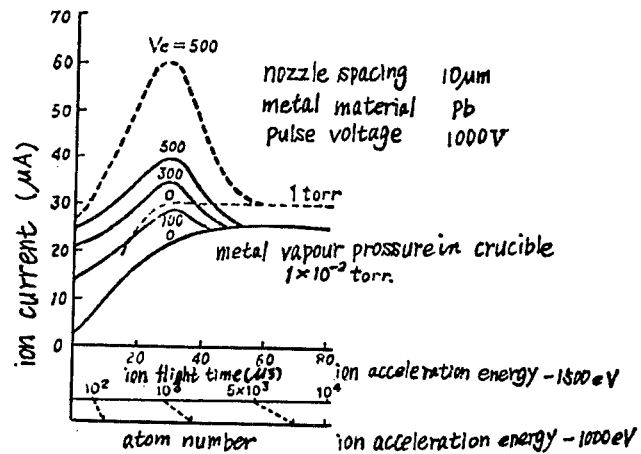
FIG. 3 is a graph plotting the number of atoms constituting a cluster measured by means of Time-of-Flight method.

The number of atoms constituting the ionized cluster may be calculated from (a) Time-of-Flight method through pulse extraction or (b) relationship between the amount of film deposition on the substrate and the ion current. In the former method (a) wherein pulses having the pulse width of 2.5 $\mu$s, the pulse repetition frequency of 60 pps and the pulse peak value of 1 KV are employed, variations in the ion current on a pulse current collector (that is, the substrate) spaced 30 cm from the accelerator electrode assembly as time advances are evaluated such that the number of the atoms within the cluster can be evaluated from a time period of flight of the cluster between both electrodes. One example of the experimental results is illustrated in FIG. 3. Analysis of these experimental results shows that the peak value of current stands when a period of about 30 $\mu$s elapses upon pulse application, that the number of the atoms within the cluster is about $10^3$ and that increase in the vapour pressure provides increase in the ion current and thus the deposition rate but not any change in the number of the atoms constituting one cluster.

Figure 4:
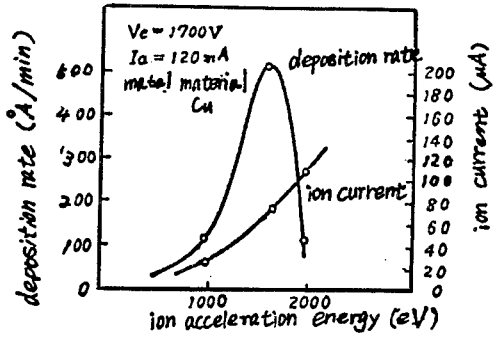
FIG. 4 is graph showing one example of experimental results to calculate the number of atoms constituting a cluster ion from the relationship between the amount of deposition on a substrate and ion current.

In accordance with the method (b), the number of the atoms constituting the cluster inclusive the neutral cluster can be calculated from the deposition rate and the deposition amount and the ion current flowing through the substrate, the deposition rate and the deposition amount being viewed with the aid of a film thickness detecting element disposed on the portion of the substrate. One example of the measured deposition rate is illustrated in FIG. 4, wherein Cu is used and the thickness detecting element (gold plated quartz crystal vibrator, the surface area $= 1$ cm$^2$) is disposed in the corner of the substrate to sense the deposition film thickness in a manner that the cluster metal vapour strikes directly with it while the ion current is sensed by means of an ammeter connected to the substrate. This is to say, although the non-ionized neutral cluster metal vapour is deposited on one major surface of the substrate confronting the crucible together with the cluster ion, the thickness detecting element is arranged responsive to only the cluster ion. The ion acceleration voltage is critical in permitting the maxium deposition rate, although the crucible temperature (therefore, the metal vapour pressure within the crucible), the shape of the ejection nozzle, the metal material used, the substrate material, etc., are important. Providing that the critical acceleration voltage is exceeded, this will provide an increase in the amount of sputtering from the substrate surface or the already deposited film and a decrease in the deposition rate. In this manner, the surface cleaning and the depositing can be adjusted by changing the acceleration voltage. The surface cleaning and depositing can be accomplished simultaneously or contiguously. This provides a distinguished character favoring the formation of a tightly deposited fine quality film.

Figure 5:
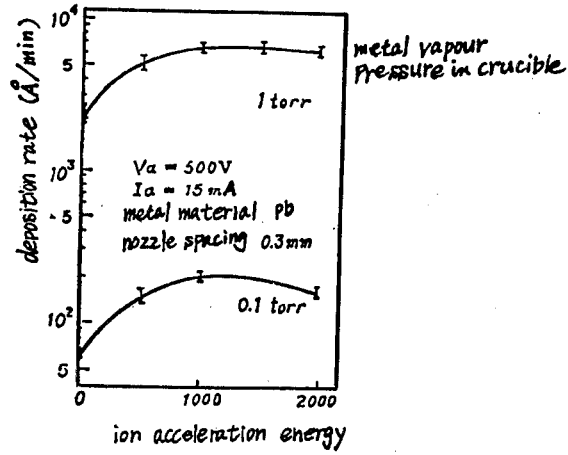
FIG. 5 is a graph showing one example of deposition characteristics measured under the condition that Pb is selected as vapourized metal material and a cluster ion is deposited together with neutral cluster metal vapour.

FIG. 4 depicts experimental results given under the conditions that the metal vapour pressure is about $10^{-2}$ Torr. and the deposition rate is several hundred Å per minute or more and the equivalent ion current is approximately 100 mA. FIG. 5 shows one example of deposition characteristics wherein the vapourization metal material is Pb and the operating state is placed at the actual or practical condition that the ionized cluster ion along with the non-ionized neutral cluster ion is deposited. As also is shown in FIG. 4, the deposition rate takes the maxium value in dependence upon the ion acceleration energy and, in the case where the metal vapour pressure is high (for example, 1 Torr.), the sputtering effects do not appear clearly on the characteristic curves. The ionization efficiency (a ratio of the cluster ions to the whole of the metal vapour clusters) increases as the electron current $I_a$ increases. It follows that an increase in the sputtering amount occurring at this time results in a deposition rate drop. As a consequence of the inventor's experiments, the ion efficiency was found to be several through several tens % and determinative upon the metal vapour pressure within the crucible, the electron current $I_a$, the electron acceleration voltage $V_a$, etc. Even if the ion efficiency assumes several %, the cluster ions will be mixed and struck with the neutral metal vapour clusters such that transmission of the kinetic energy therebetween affords the characteristical merits to the deposited film.

The formation of a tightly deposited fine quality film in this way is due to the following reasons. By closing the high pressure metal vapour within the crucible, the chamber accommodating the substrate can be held at a high vacuum state and the substrate surface is cleaned up immediately before the film deposition thanks to the sputtering effects originated due to cluster ion bombardment. Moreover, a film is desposed on the substrate surface without re-pollution of the substrate surface since ion bombardment continues to take place during film deposition. This is distinguishable from a conventional deposition method wherein the surface cleaning and depositing procedures are independently carried out during separate processes.

As to the adhesion or the deposit morphology, the principal factors to be considered are as follows: (1) to sputter and clean the substrate surface by ion bombardment (improvement of adhesion); (2) to etch the surface deeply (mechanical improvement of adhesion); (3) to blend sputtered substrate material with coming evaporant particles and to stick again on the surface (formation of interfacial layer); (4) to continue the sputtering effect during film formation (change in the growth morphology); (5) to provide the thermal energy, converted form kinetic energy of bombarded ions, to the surface of a substrate and then a depositing layer, giving a high surface temperature without necessitating bulk heating (change in the growth morphology and increase in chemical reaction); (6) to provide enhanced diffusion, due to high defect concentrations introduced by the high energy flux, to the high temperature substrate (enhancing of interfacial layer formation and change in the growth morphology); (7) to introduce the ion implantation effects (enhacing of interfacial layer formation); and (8) to influence the nucleation and growth of the deposition due to the migration of depositing material particles.

The last factor is a characteristic in ionized-cluster beam deposition. The migration occurs under the condition that ionized and neutral clusters are broken up into each atomic state of particles and scattered on the depositing surface under a high temperature, due to the thermal energy converted from the kinetic energy of cluster ions, resulting in a great influence upon the improvement of the crystalline state of depositing thick film. The ionized-cluster beam deposition is very interesting as a new crystal regrowth method with increased deposition rate (several hundred Å-several μm per minute). It permits single-crystal films such as ZnS and $S_i$ to be disposed on a single-crystal substrate of rock salt.

In addition to the many characteristics stated above, the ionized-cluster beam deposition of the present invention has another important characteristic, that is, the charge-mass ratio of the cluster ion is extremely small. In other words, $q = e$ because of ionization subject to only one atom within the atoms consisting of one cluster ion and the mass is substantially proportional to the number of the atoms making up the cluster. Therefore, the cluster ion beam will hardly spread due to space charge when attracting the cluster ion beam of several amperes. In addition, it is no requirement to neutralize positive charges having the tendency of accumulating on the substrate surface when the cluster ion beam strikes with an insulator substrate. As a result, this permits and facilitates film deposition on semiconductor substrates, insulator substrates or low melting point substrates. The invented ionized-cluster beam deposition shows the maximum advantage for the fabrication of printed circuits on mylar substrate, etc., and the formation of alloy electrode films on semiconductor substrates.

An adjustable shutter 21 may be provided in front of the substrate 19 in order to define a desired pattern and control accurately the deposition period. The substrate 19 may also be held at the same potential as the ion extractor electrode 6 and further negative or positive potential may be applied, as occasion may require. More accurately, negative voltage supply permits the ionized cluster 20 to be further accelerated whereas positive voltage supply permits the same to be decelerated and electrons to be extracted from the filament 10 in order to neutralize the positive charges accumulated on the substrate.

Figure 6:
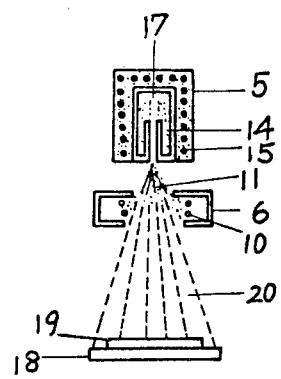
FIG. 6 is a cross sectional view of another preferred form of a cluster ion source embodying the present invention.

Although in the device of FIG. 2 the substrate is positioned above the crucible, the crucible may be positioned as an alternate in a manner that the cluster is oriented downwardly. In this instance provision should be made to preclude outflow of material solution, for example, implementation shown in FIG. 6, wherein the components disclosed herein are given the same numbers as in FIG. 2 wherever possible in order to point up the close relationship.

An experimental device will be given below. The crucible 5 is made of $T_a$, C, etc. A desired metal rod such as $P_b$ and $C_u$ is introduced into the crucible 5 and heated up to the melting point and vapourized by means of electron bombardment heating. The electron beam is generated for the ionization purpose under the filament heating power of 20-30 W, the electron beam current of 100 mA-300 mA and the acceleration voltage of 15 KV. As a matter of fact, the acceleration voltage is selectable in the range of several hundred V-several KV. The ionized cluster is accelerated in the position opposite to the electron beam upon voltage supply of 15 KV. Satisfactory results are obtained in the case of the substrate 19 of stainless steel, plastics or wood.

When the film of $P_b$ is deposited on the stainless steel, the deposition rate is 1-3 μm per minute and is fully competitive with the system (i) operating in a discharge region, while the ammeter 22 coupled between the substrate support (the surface area of several tens 10 $cm^2$) indicates the ion current is 20-30 μA.

In the illustrated and disclosed example, the ionizing of the cluster consists of a voltage supply between the doughnut shaped ion accelerator electrode and the material vapour crucible, electron acceleration and cluster ionization responsive to that voltage supply and ion acceleration in the opposite direction responsive to the same voltage supply. An alternative ion source is illustrated in FIG. 7 wherein electrode assemblies are disposed independently of each other.

Figure 7:
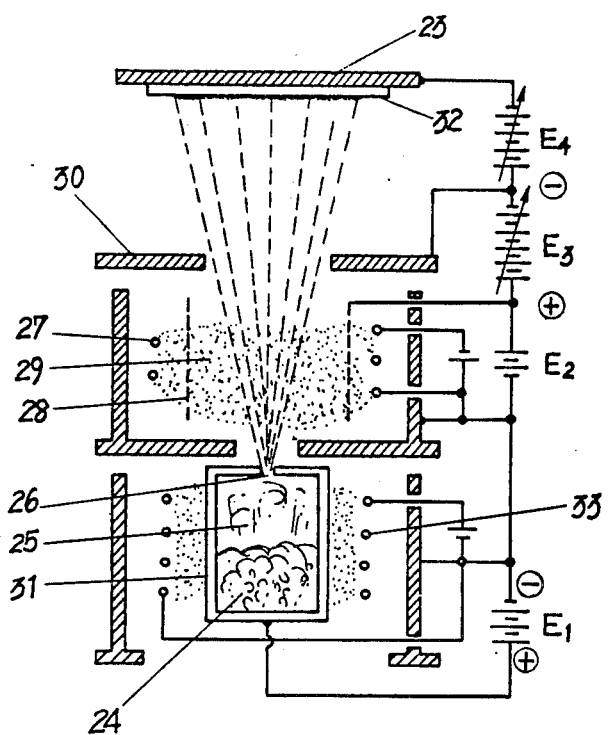
FIG. 7 is a detailed illustration of a cluster ion beam deposition system embodying the present invention.

In FIG. 7, the ion source includes a crucible 31, a substrate 32, a substrate support 23, an electron issuing filament 33 for heating the crucible 31, a material 24 to be vapourized, a vapourized material 25, an ejection nozzle 26, an electron issuing filament 27 for ionizing the cluster, an electron accelerator electrode 28, an electron cloud 29 established for the purpose of ionizing the cluster and a cluster ion accelerator electrode 30. The substrate 32 is housed in a sealed chamber which is held at a high vacuum region ($10^{-4}$-$10^{-6}$ Torr.). Electrons from the filament 33 are accelerated toward the crucible 31 by an electron accelerator voltage source $E_1$, thereby heating the crucible 31 due to electron bombardment. The result is that the material 24 is vapourized with the vapour pressure of $10^{-2}$-$10$ Torr. Therefore, the material is ejected out through the nozzle 26 to form atom aggregates or clusters about the nozzle due to adiabatic expansion. The atom aggregates or the clusters are ionized as they pass through the electron cloud 29 established by means of the electron accelerator electrode 28 and the filament 27. Then, they are accelerated by the cluster ion accelerator electrode 30 and the substrate support 23 to reach the substrate 32 together with non-ionized neutral clusters.

Figure 8:
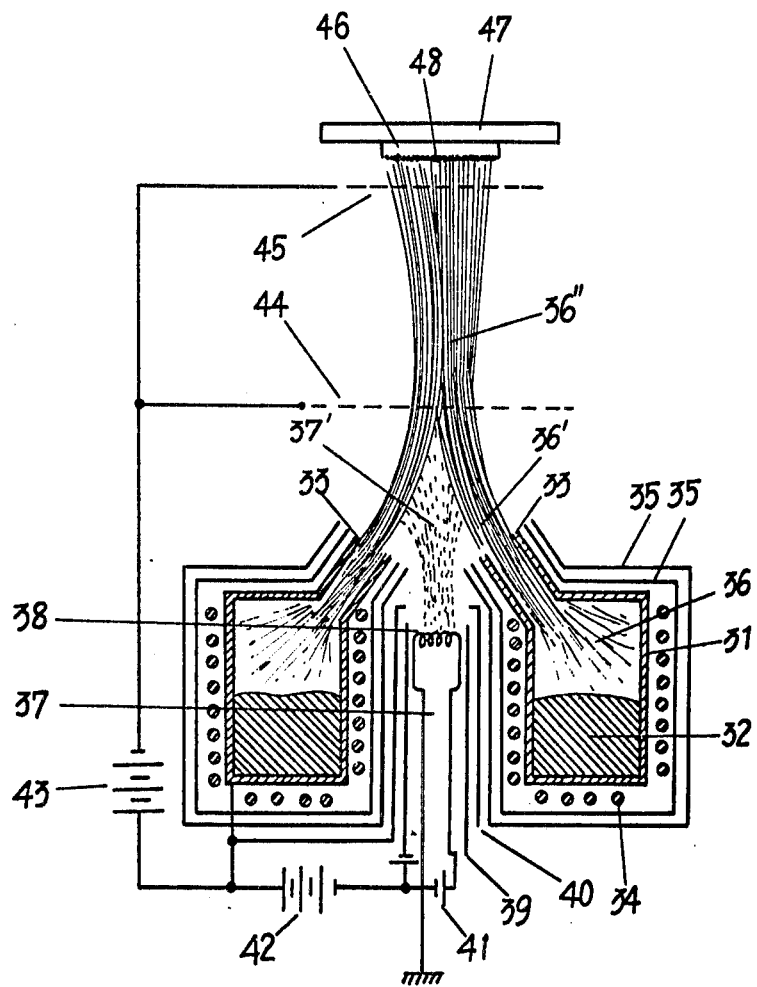
FIG. 8 is a cross sectional view of still another preferred form of a cluster ion source embodying the present invention.

When it is required to achieve ion plating on a substrate of the large area, it is preferable to create a vapour beam or ionized vapour beam of the permissible maxium cross section and of the uniform distribution. FIG. 8 illustrates one example which is effective to meet the above requirements.

In FIG. 8, the illustrative embodiment includes a doughnut shaped crucible 31 of the hollow configuration in which a material 32 of a simple substance or compound to be deposited is introduced, a plurality of ejection nozzles 33 inclined with respect to the crucible 31, a heating coil 34 disposed about the crucible 31 for heating the material 32 through the crucible 31 and a thermal shield 35 of the tier configuration. The heating temperature due to the heating coil 34 is so preconditioned that the material 32 is vapourized within the crucible 31 at proper vapour pressure. For example, in the case that the atmosphere surrounding the crucible is held at $10^{-6}$-$10^{-4}$ Torr. the vapour pressure of the material vapour 36 within the crucible 31 is selected at $10^{-3}$-1 Torr. to place the material vapour 36 into the thermal equilibrium state. Proper selection of the diameter and the length of the nozzles 33 insures that the gas pressure within the crucible 31 should be maintained more than 10 times greater than that of the surrounding atmosphere where the deposition procedure is carried out, depending upon various deposition conditions and selection of the vapourized material.

The plurality of the nozzles 33 are positioned symmetric with respect to each other and oriented such that the material vapour beams 36' issuing from the nozzles 33 flow together at a specific point and the composition 36" of the beams advances against the substrate 47.

The ion source of FIG. 8 further includes an ionizing electron gun 37 disposed on the axis of symmetry as to the nozzles 33, which consists of an electron emitting filament 38, a Wehnelt electrode 39, an anode 40, a filament heating power source 41, an ionizing electron beam accelerator power source 42, an ion accelerator power source 43, an accelerator electrode 44, a shutter 45, a substrate 46, and a substrate support 47.

With such an arrangement, the electron beam 37' derived from the gun 37 serves to ionize the material vapour 36" of high density and the thus ionized vapour beam along with non-ionized vapour beam is accelerated toward the substrate 46 via the shutter 45 by the accelerator electrode 44 at negative potential. This results in the formation of a film 48.

Figure 9:
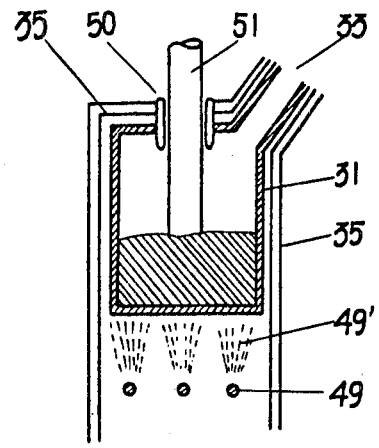
FIGS. 9 through 12 are illustrations of various modifications useful with the ion source shown in FIG. 8.

While FIG. 8 shows a method for heating the crucible 31 through the use of the heating coil 34, this method may be substituted by an electron bombardment heating system which contains an electron bombardment heating filament 49. The reference number 19' designates electrons 49', as is shown in FIG. 9.

In addition, an insertion opening 50 is formed in the crucible 31, which enables continuous supply of material 51 to be deposited.

Figure 10:
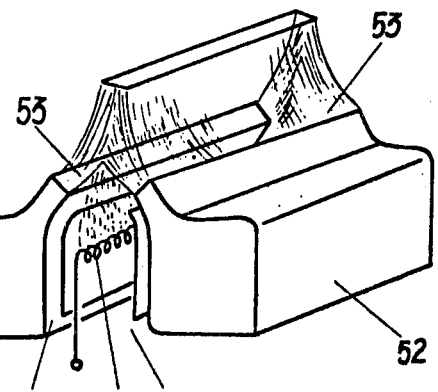
Figure 11:
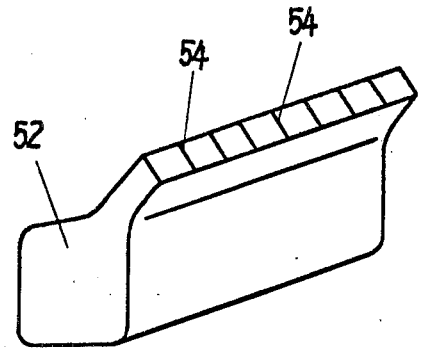
Figure 12:
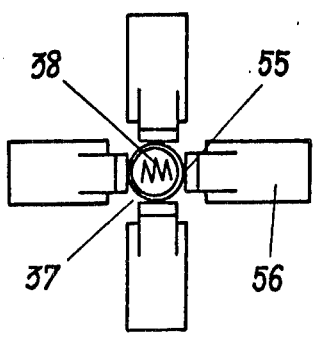

It is obvious that various modifications may be made in the configuration of the crucible and the nozzles. For example, when it is desired to dispose a film on a wide substrate, an arrangement of FIG. 10 wherein the crucible 52 and the nozzles 53 are of the lateral profile is useful. In this instance the nozzle 52 may be divided into a predetermined number of groups by inserting partitions 54. In FIG. 12, four crucibles 56 are crossed and the nozzle 55 is disposed at the cross point.

Meantime, the foregoing embodiments are believed apparently to form a uniform vapour atmosphere. However, microscopic analysis shows that the vapour atmosphere contains not only atomic or molecular particles but also big vapour particles in the liquid form. They will severely compromise uniformity of a deposited film during deposition on a substrate. More particularly, when boiling phenomenon occurs to form splashes in heating the crucible, this will provide waste of materials to be deposited and decline in film quality.

Figure 13:
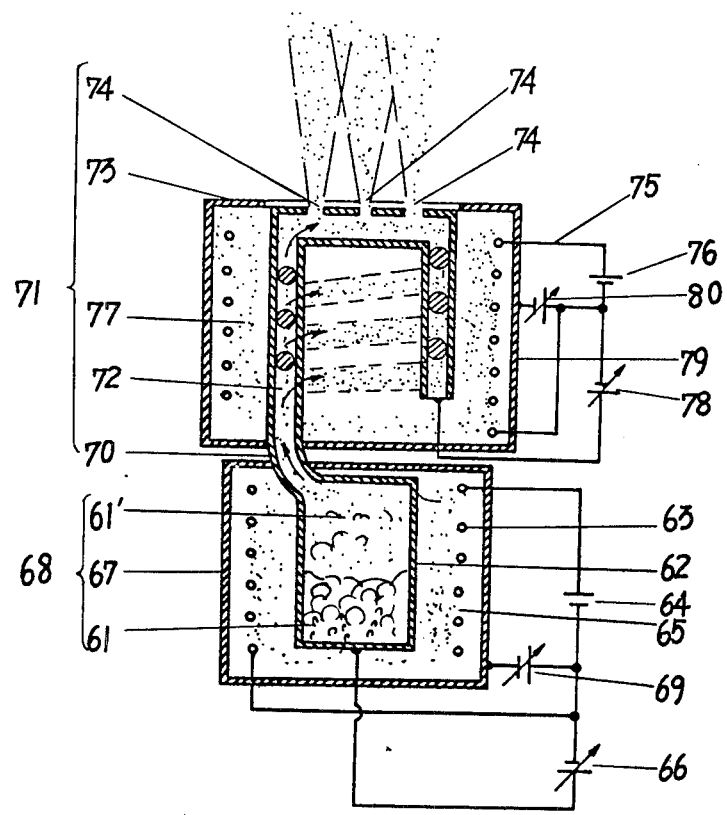
FIGS. 13 and 14 are cross sectional views of yet another preferred forms of an ion source embodying the present invention.
Figure 14:
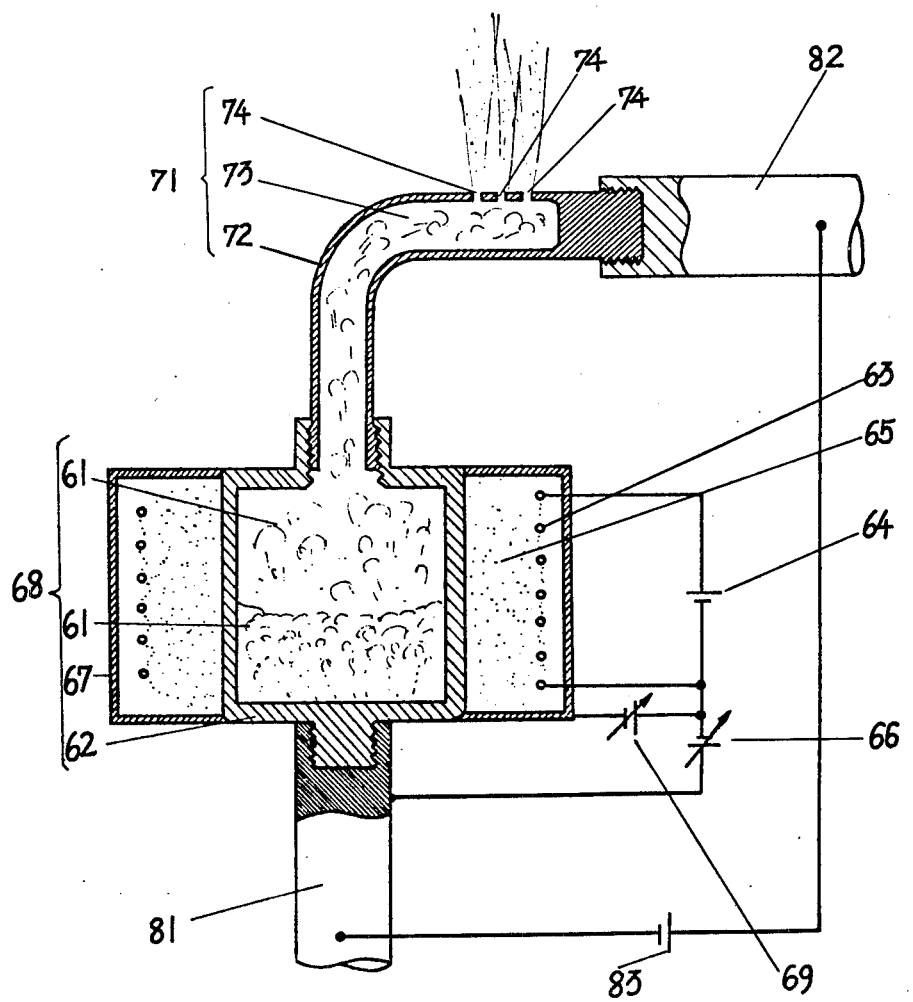

FIGS. 13 and 14 illustrate a powerful approaches to overcome the above discussed shortcoming by making the vapour particles as fine as possible so that they become atomic or molecular vapour particles.

The illustrated embodiment in FIG. 13, includes a material 61 to be vapourized inserted within a crucible 62, a spiral shaped filament 63 disposed about the crucible 62, a filament heating power source 64, electrons 65 derived form the filament 63, an electron accelerator power source 66 connected between the crucible 62 and the filament 63 for electron accelerating purposes, a thermic shield and electron beam formation electrode 67, a crucible region 68 consisting of the crucible 62, the filament 63 and the electron beam formation electrode 67, a power source 69 for supplying the electrode 67 with the same potential as the filament 63 (or somewhat negative potential), a vapour tubing 70 for transmitting the material vapour 61' in the crucible into a vapour transportation region 71, a vapour discharge region 73 communicating with the transportation 72 for ejecting the vapour in such a jet, ejection nozzles 74 formed in the discharge region 73, a spiral shaped filament 75 disposed about the transportion 72 and the discharge region 73, a filament heating power source 76 for issuing electrons 77, an electron accelerator power supply 78 connected between the transportation 72 and the filament 75, a thermic shield and electron beam formation electrode 79, and a power source 80 for supplying the electron formation electrode 79 with the same potential as the filament 73.

Upon current flow through the filament 73, the filament 73 is heated to generate electrons 75, the thus generated electrons 75 being accelerated toward the crucible 72 by the power source 76 to strike with the same, with the result that the material vapour 71' occurs within the crucible 72. The material vapour 71' contains atomic or molecular vapour particles, big atom aggregates and liquid particles and, in some cases, also splashes as noted earlier. When such a mixture enters into the transportation 72, these particles being transmitted are broken up to become atomic or molecular particles each time they strike with the inner wall of the tubing 72 because the crucible 78 is maintained at high temperature by means of the electron bombardment heating scheme containing the filament 75, the filament heating power source 76, the electron accelerator power source 78 and the electron beam formation electrode 79. The material vapour 71' becomes the ideal corpuscular vapour, thereby permitting fine quality deposited films.

Distinction between the embodiments of FIGS. 13 and 14 is that the crucible 62, the vapour introduction region 70, the transportation region 72 and the vapour discharge region 73 are incorporated into a single unit, through which heavy current flows to heat them together with the above disclosed electron bombardment heating scheme. The crucible 72 has the bottom portion connected with a crucible side wall heating power leading rod 81 and the upper portion connected with the vapour transportation tubing 72. The upper end of the tubing 72 is connected with the vapour discharge region 73 and then the discharge region heating power leading rod 82. The transportation tubing 72 and the discharge region 73 have the cross section smaller than that of the crucible 62. The joint of the transportation region 72 and the discharge region 73 is curved in a manner to prevent the boiling phenomenon and permit the vapour stream to strike with the inner wall a lot of times.

In heating the crucible at considerably high temperature, the thermal energy occurring at this time has only a small value when viewing from the view point of kinetic energy. That is to say, as will be clear from the following formula, $KT/e = T/1.16 \times 10^4$, conversion of thermal energy corresponding to T (° K.) into kinetic energy shows that, for example, when heating the crucible up to 2300° K., kinetic energy assumes only 0.2 eV.

Figure 15:
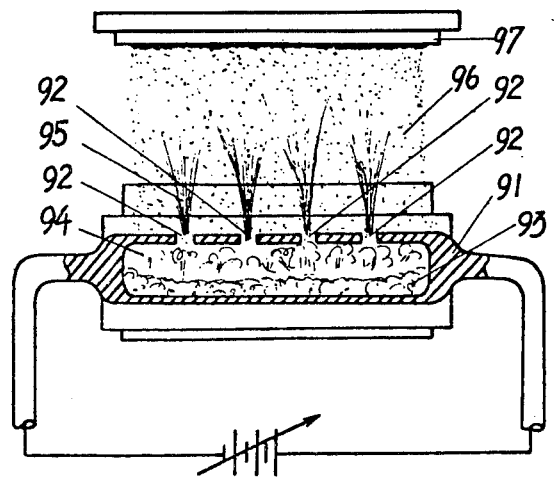
FIGS. 15(a) and 15(b) are cross sectional views of another preferred form of a material vapour source embodying the present invention.
Figure 15:
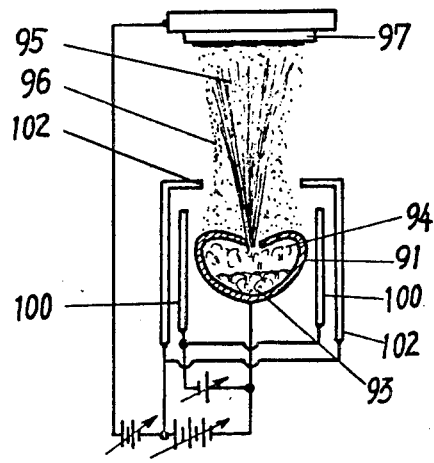
Figure 16:
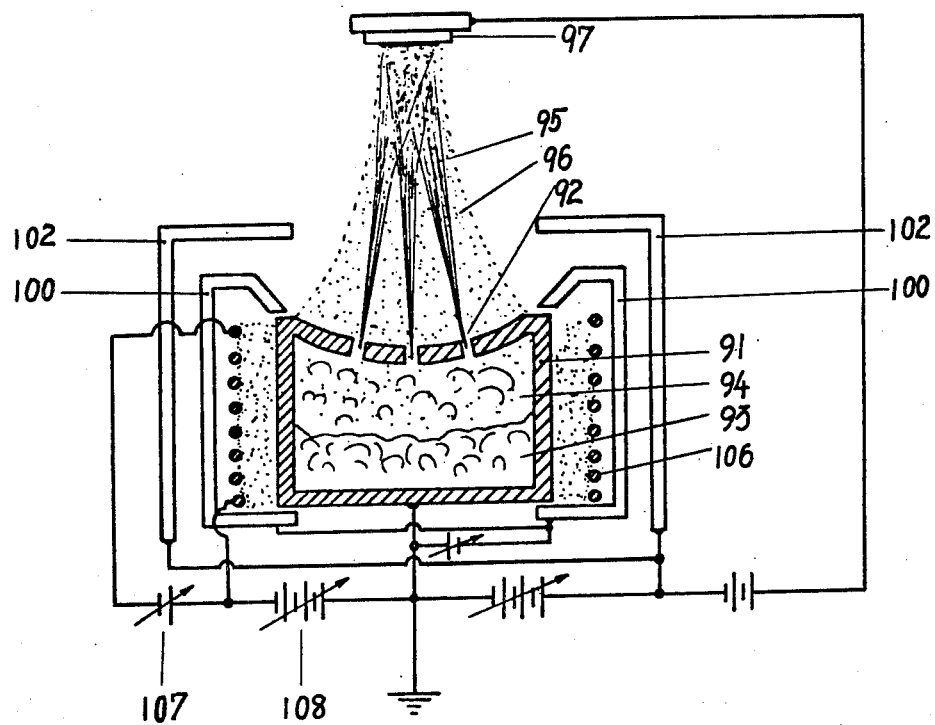
FIG. 16 is a cross sectional view of a modification of the source shown in FIGS. 15(a) and 15(b).

The embodiments of FIGS. 15(a), 15(b) and 16 are adapted to overcome the above discussed shortcoming, wherein a crucible is made of material having the function of emitting electrons and a nozzle formed in the crucible issues material vapour while the crucible itself issues electrons, thereby attaining improvement in crystalline state of deposited films due to combined effects of a material vapour stream and an electron beam.

Referring to FIGS. 15(a) and 15(b), a sealed crucible 91 is made of proper material such as $T_a$ and W which has the function of satisfactorily emitting electrons at high temperature. As shown, electrons 96 originated from the crucible 91 are focused and accelerated through an electronic lens system containing the crucible 91, Wehnelt electrodes 100 and anodes 102 and thereafter combined with a vapour jet or cluster 95 to reach the substrate 97. The vapour jet 95 which takes the form of atom aggregates or clusters tied by Van der Waals force, is broken up as soon as it strikes with the substrate. This contributes growth of the deposition due to the migration of depositing material particles. Simultaneously, the high speed electron beam heats the interfacial surface of a deposited film as it strikes with the substrate. Improvement in crystalline state of the deposited film is therefore attained.

In FIG. 16, a filament 106 wound about the crucible 91 is heated through a power source 107 and then supplied with positive potential through a power source 108, such that the crucible 91 is heated by electrons 109 derived from the filament 106. The same advantages set forth with reference to FIGS. 15(a) and 15(b) are applicable to the embodiment of FIG. 16.

Figure 17:
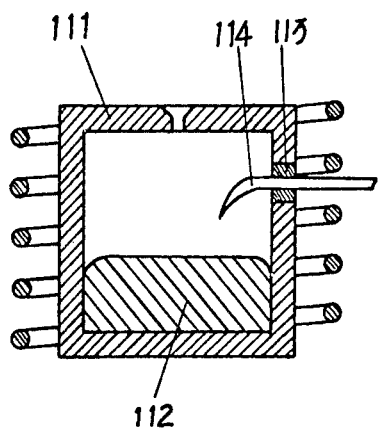
FIGS. 17 through 20 are cross sectional views of various modifications in the crucible shown in FIG. 1.
Figure 18:
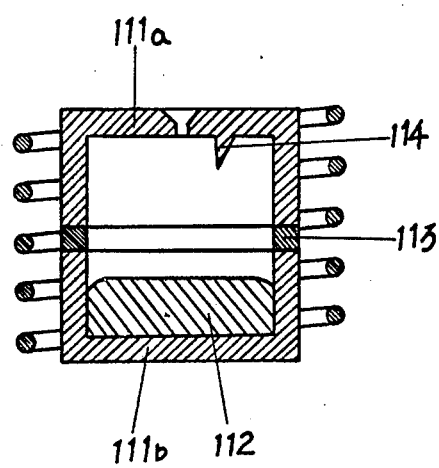

FIGS. 17 and 18 illustrate modifications in the cluster vapour generating means suitable for vapouring a high melting point material.

In FIG. 17, a crucible 111 is made of proper material such as carbon and tungsten and adapted to facilitate the insertion of solid metal 112. A discharge electrode 114 is disposed within the crucible 111 with electrical isolation therefrom via an isolator 113. An electron emitting filament 115 is provided outside of the crucible 111.

The crucible 111 is heated to an extent to vapourize the metal 112 by electron bombardment. Application of direct current voltage between the discharge electrode 114 and the metal 112 via the crucible 111 initiates arc discharge about the metal 112 at vapour atmosphere of $10^{-4} - 10^{-2}$ Torr. so that the surface temperature of the metal 112 is increased to permit high pressure vapour of 1 Torr. or more within the crucible 111.

With reference to FIG. 18, the crucible 111 is divided into the bottom portion 111b and the upper portion 111a, both of them being coupled in a hermetic manner with intervention of an insulator 113'. The upper portion 111a is provided with a discharge protrusion 114'. Upon high voltage supply between the upper portion 111a and the bottom portion 111b, arc discharge is produced between the metal 112 and the discharge region 114'.

Figure 19:
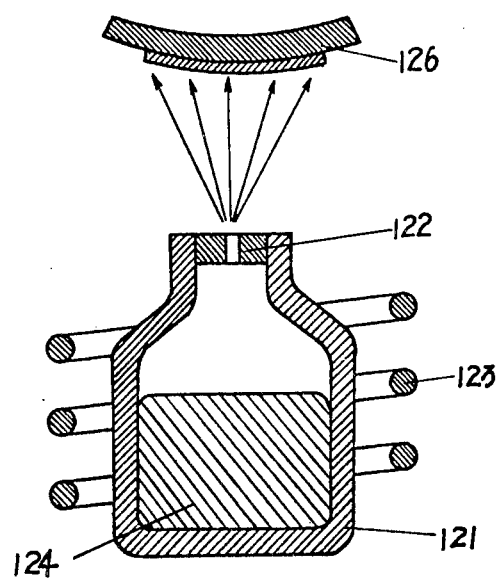
Figure 20:
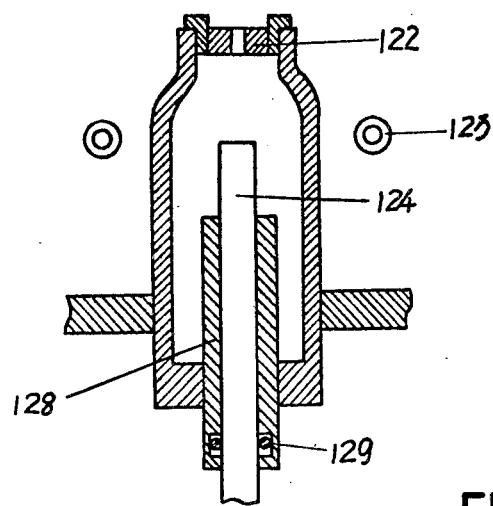

Other modifications in the crucible shown in FIGS. 19 and 20 are useful for high melting point metal materials to be deposited.

In FIG. 19, an enclosure 121 is made of high melting point material not responsive to high frequency energy for example ceramics and provided with a metal made nozzle 122. A high frequency coil 123 is wound around the enclosure 121 in which a solid metal 124 of high melting point to be deposited is inserted.

By high frequency energy derived from the high frequency coil 123, the metal material 124 is directly heated and solved to form the vapour of the metal 124 within the enclosure 121. The portion of the vapour is ionized due to high frequency discharge behavior. The vapour inclusive the thus ionized vapour is ejected through the nozzle 122 toward the substrate 126.

In the modification of FIG. 20, a rod shaped metal material 124' is contineously introduced into the interior of the enclosure 121' along a cyclindrical guide 128. An O ring 129 is intervened between the metal material 124' and the guide 128.

Figure 21:
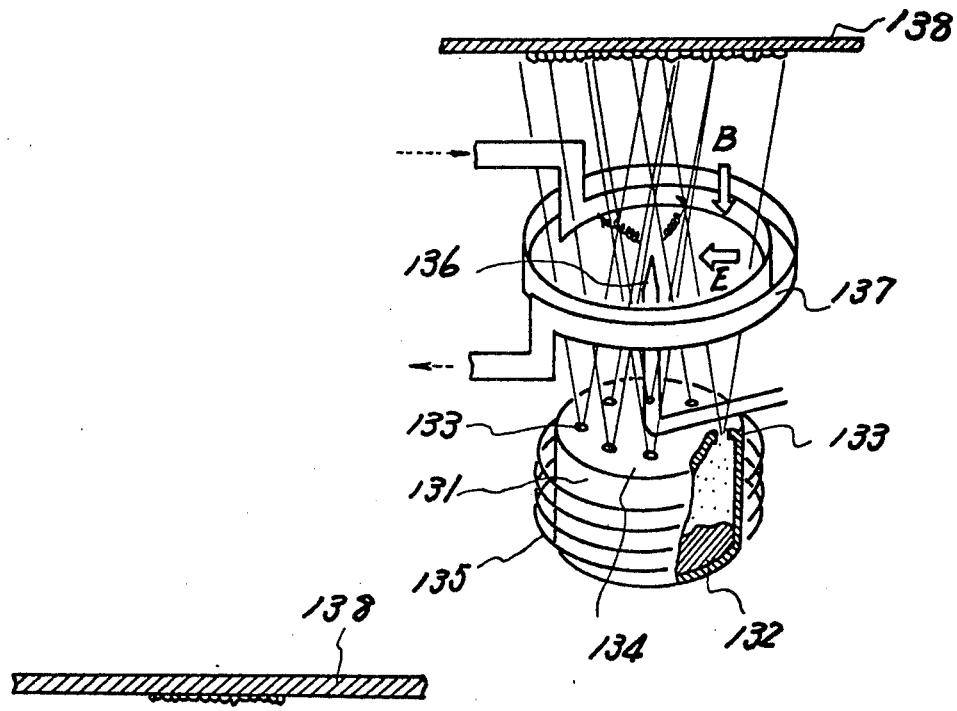
FIGS. 21 and 22 are perspective views of modifications in the cluster ion generating means shown in FIG. 1.
Figure 22:
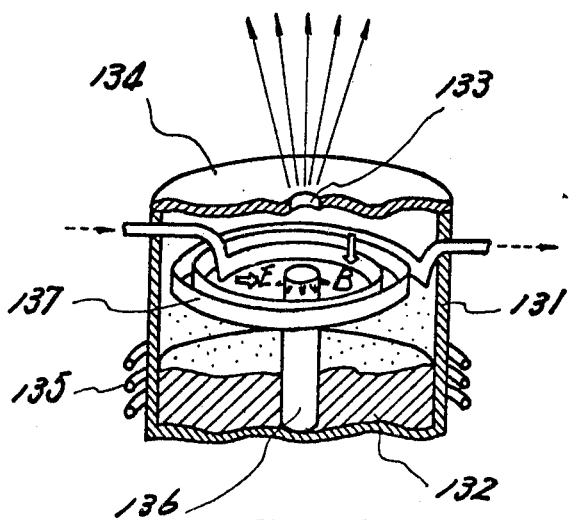

A few examples of a cluster ion generating unit which generates a cluster ion easily as a cluster passes through crossed electric field and magnetic field established with a simple construction containing no magnet coil, are illustrated in FIGS. 21 and 22.

In FIG. 21, a metal vapour generating crucible 131 contains material 132 desired to be ionized and is sealed by an upper cover 134 having one or more nozzles 133. An electron bombardment filament 135 disposed about the crucible 131 serves to heat the crucible 131. As discussed previously, the metal vapour within the crucible 131 is held at $10^{-2}$–1 Torr. and ejected via the nozzle 133 into a high vacuum region of $10^{-4}$ Torr. The thus ejected metal vapour forms clusters by the adiabatic expansion.

Meantime, a rod-shaped cold cathode or hairpin shaped hot cathode 136 is provided above the crucible 131, which responds to applied voltage to generate electrons, while a loop or spiral anode 137 is positioned to confront the cathode 136. The cathode 137 is held at proper potential with respect to the cathode 136, for example, 100–300 V selected to allow the maximum ionization efficiency, to attack electrons from the cathode 136. At this time, direct current heavy current flows through the anode 137 to establish a magnetic field B in an orthogonal relationship with reference to an electric field E established between the cathode 136 and the anode 137. Therefore, electrons from the cathode 136 to the anode 137 follow spiral trajectories. The clusters are effectively ionized as they pass through the anode 137 to form cluster ions, which in turn are accelerated toward a substrate 138 together with neutral clusters due to negative high intensity electric field developed between the anode 137 and the substrate 138. In the embodiment of FIG. 22, an electrode assembly consisting the cathode 136 and the anode 137 is disposed within the interior of the crucible 131.

While only certain embodiments of the present invention have been described, it will be apparent to those skilled in the art that various changes and modifications may be made therein without departing from the spirit and scope of the invention as claimed.

What is claimed is:

1. A method of depositing a film on a substrate which comprises the steps of positioning in a high vacuum region at least one container for holding the material to be vaporized, an ion extraction electrode containing an electron emission source and a substrate on which the film of said material is to be deposited, applying an acceleration voltage between the container and the extraction electrode, said container having a positive potential and the extraction electrode having a negative potential, vaporizing the material disposed within the container by heating said material so that the vapor pressure within the container is at least ten times greater than that of the high vacuum region, ejecting the vapor from said container into the high vacuum region, thereby forming aggregates or clusters of atoms or molecules by adiabatic expansion, irradiating the aggregates or clusters with an electron beam from the electron emission source contained within the ion extractor electrode to form aggregate or cluster ions and accelerating the cluster ions toward the substrate to form a deposited film thereon.

2. The method of claim 1, wherein the material in the container is heated by resistive heating.

3. The method of claim 1, wherein the material in the container is heated by electron bombardment.

4. The method of claim 1, wherein the material in the container is heated by high-frequency energy.

5. The method of claim 1, wherein the material in the container is heated by forming a discharge arc above the surface of the material, thereby increasing the surface temperature of the material.

6. The method of claim 1, wherein the material to be vaporized is continuously supplied to the interior of the container.

7. The method of claim 1, wherein the high vacuum region is held at a gas pressure of between $10^{-3}$ and $10^{-6}$ mm Hg (Torr.) while the vapor pressure of the material within the crucible is equal to or greater than about $10^{-2}$ mm Hg (Torr.).

8. The method of claim 1, wherein the vapor is ejected from the container through at least one nozzle into the high vacuum region.

9. The method of claim 1, wherein the container is made of a material having electron emission capability so that when the container is heated it emits electrons from the surface of the container, said electrons being accelerated by a magnetic field or an electric field to reach the substrate together with the vapor clusters, thereby fabricating the deposited film on said substrate.

10. The method of claim 8, wherein the vapor is transported from the container to the nozzle.

11. The method of claim 10, wherein the vapor is heated while transported from the container to the nozzle in order to keep the vapor particles as fine as possible.

12. The method of claim 1, wherein the acceleration voltage is in the range of several hundred V to several KV.

13. The method of claim 1, wherein the substrate is made of metal, an insulator, or a semiconductor.

14. The method of claim 1, wherein an ion accelerator electrode assembly is disposed in the high vacuum region and a filament is contained within or disposed independently of the electrode assembly, said ion accelerator electrode assembly being supplied with high voltage effective to focus and accelerate electrons derived from the filament, the cluster ions formed by irradiation with the thus focused and accelerated electrons being accelerated in a direction opposite to that of these electrons.

15. The method of claim 1, wherein the container is sealed.

16. The method of claim 1, wherein the ejection of the vapor from the container forces the material into a supercooled state.

17. The method of claim 1, wherein the ionization of only one atom constituting the material vapor aggregates or clusters permits the entirety of the clusters to be ionized.

18. The method of claim 8, wherein a plurality of nozzles are utilized, and vapor ejected from each nozzle being combined to form a common stream.

19. A deposited film fabricated in accordance with the ionized cluster beam deposition method of claim 1.

20. A method of depositing a film on a substrate which comprises the steps of positioning in a high vacuum region maintained at a gas pressure of less then $10^{-4}$ Torr at least one container for holding the material to be vaporized, an ion extraction electrode containing an electron emission source and a substrate on which the film of said material is to be deposited, applying an acceleration voltage between the container and the extraction electrode, said container having a positive potential and the extraction electrode having a negative potential, vaporizing the material disposed within the container by heating said material so that the vapor pressure within the container is at least ten times greater than that of the high vacuum region, ejecting the vapor from said container into the high vacuum region, thereby forming aggregates or clusters of atoms or molecules by adiabatic expansion, irradiating the aggregates or clusters with an electron beam from the electron emission source contained within the ion extractor electrode to form aggregate or cluster ions and accelerating the cluster ions toward the substrate to form a deposited film thereon.

* * * * *